United States Patent [19]

Gregorian

[11] 4,179,665
[45] Dec. 18, 1979

[54] SWITCHED CAPACITOR ELLIPTIC FILTER
[75] Inventor: Roubik Gregorian, Sunnyvale, Calif.
[73] Assignee: American Microsystems, Inc., Santa Clara, Calif.
[21] Appl. No.: 940,473
[22] Filed: Sep. 8, 1978
[51] Int. Cl.$^2$ .............................................. H03F 1/36
[52] U.S. Cl. .................................. 330/107; 328/167; 330/109; 333/173
[58] Field of Search .................. 328/167; 330/51, 107, 330/109, 303; 333/70 A

[56] References Cited
PUBLICATIONS

Delagrange—"FETs in RC Network Tune Active Filter"—Electronics, 12/1970, p. 76.

*Primary Examiner*—Lawrence J. Dahl
*Attorney, Agent, or Firm*—Owen, Wickersham & Erickson

[57] ABSTRACT

A switched capacitor sampled data elliptic filter for data transmission or communication systems is disclosed. The filter section comprises three integrating operational amplifiers connected in series with a negative feedback connection between the output of the second operational amplifier and the input to the first operational amplifier, which is also connected to the input voltage source. Signals via a feed forward connection from the input voltage source and the outputs of the first and second operational amplifiers are summed by the third operational amplifier. Switched capacitors in the feed forward connection, the negative feedback connection, the inputs to all three operational amplifiers and in feedback sections of the first and third operational amplifiers are all connected to a two-phase clock driver operated at a preselected frequency. The circuit arrangement realizes finite transmission zeros in the transfer function which produce a sharp transition from pass band to stop band with a lower order, and the values of all capacitors may be calculated to provide the filter with a loss response within preselected limits.

5 Claims, 3 Drawing Figures

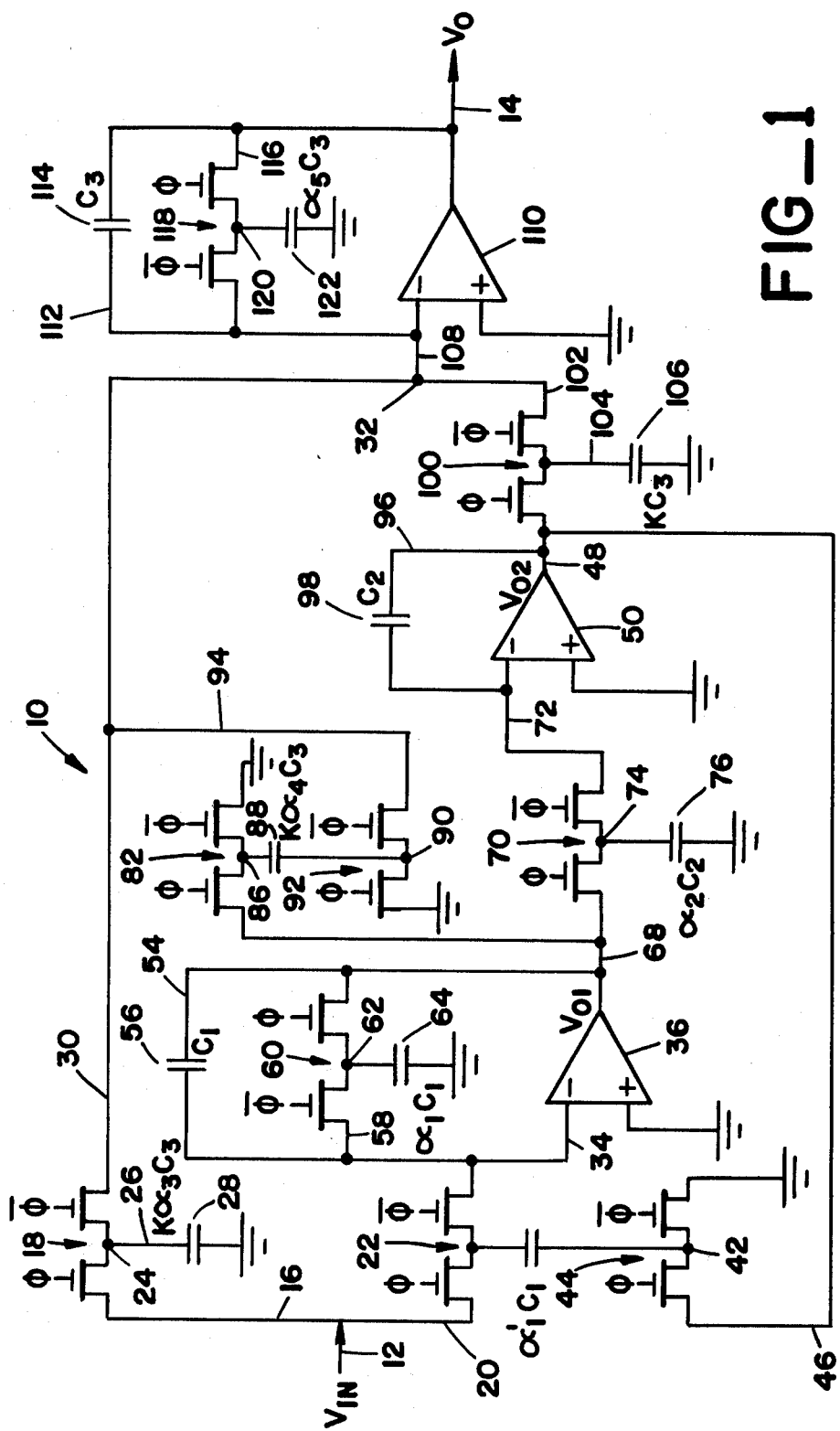
FIG_1

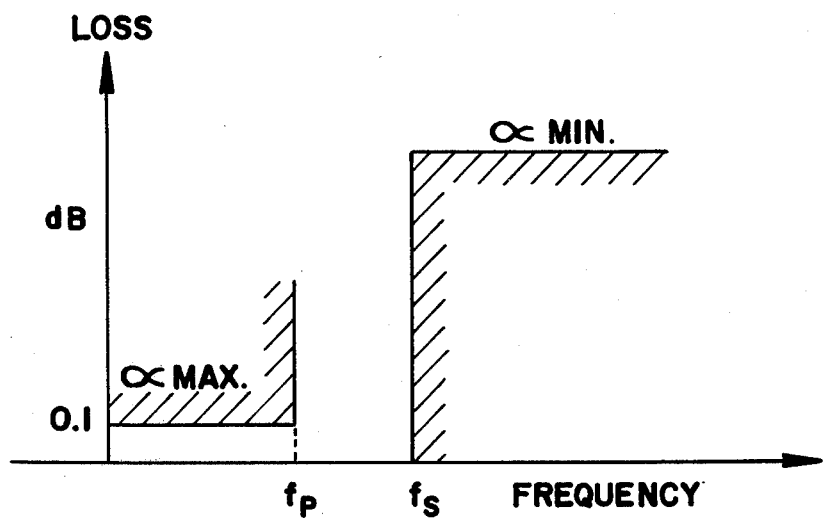
FIG_2
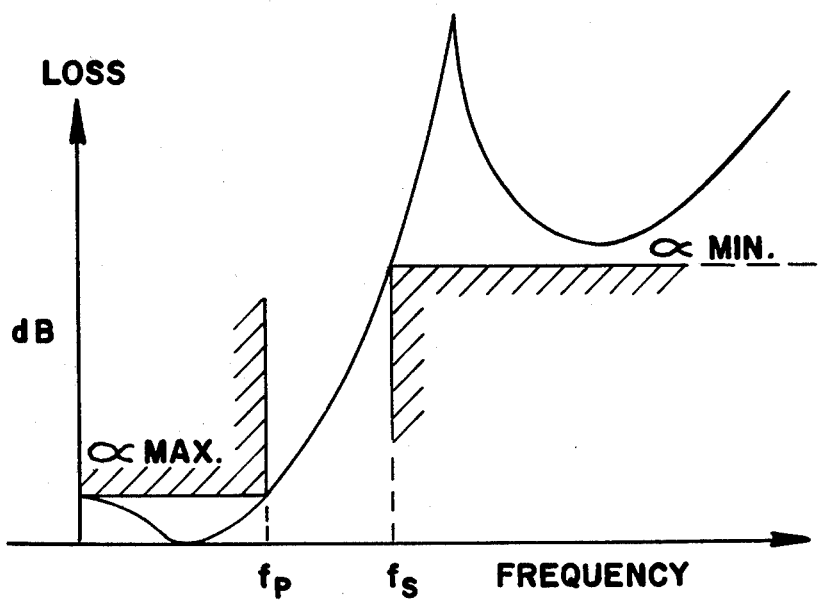
FIG_3

4,179,665

SWITCHED CAPACITOR ELLIPTIC FILTER

This invention relates to electronic filters for data transmission or communication systems and electronic control equipment, and more particularly, it relates to a sampled-data elliptic filter than can be implemented as an integrated circuit semiconductor device.

BACKGROUND OF THE INVENTION

With the development of electronic data transmission systems using large-scale integration techniques, a need arose to provide efficient and compatible frequency selective circuits for such systems. Conventional active filters using thin film or other hybrid technology, although an improvement over discrete component passive filters, failed to meet the requirements of LSI data system applications. Charge-transfer devices (CTD) were suggested as one approach for implementing analog sampled-data filters but were found to require a large plurality of stages to provide the necessary narrow transition from pass band to stop band and were therefore relatively inefficient in their use of silicon area. Also such CTD filters has an inherently high insertion loss, i.e. around 20 db.

Another more successful approach to the problem was the more recent development of so-called "switched capacitor" filters using MOS technology. (See MOS Sampled Data Recursive Filters Using Switched Capacitor Integrators, IEEE Journal of Solid-State Circuits, Vol. SC-12, No. 6, December 1977).

In the aforesaid article, a sampled data filter circuit is disclosed utilizing a pair of operational amplifiers in series, each being connected in parallel with a capacitor. Switches in the circuit, controlled by clock pules, alternate between their two positions to provide two different outputs. The reference circuit operates to realize a pair of complex poles in the transfer function for the circuit and resulted in a relatively low sensitivity filter. However, it failed to provide a filter with a sharp enough transition at the desired frequency. The present invention solves the aforesaid problem and provides an improved sampled data filter having several advantages including greater efficiency with a loss characteristic that closely approximates the more ideal elliptic filter.

BRIEF SUMMARY OF THE INVENTION

In accordance with the principles of the invention a low pass filter is provided which is particularly adapted for implementation as an MOS (metal-oxide-silicon) semiconductor device that can be included as part of an electronic data system formed as one or more LSI (large scale integrated) circuit devices. In circuit terms, the filter according to the invention is comprised of three operational amplifiers connected as integrators essentially in series and in conjunction with switched capacitors controlled by continuously-alternating clock signals applied to MOS switching elements. The filter circuit of the present invention is configured so that it provides a transfer function that not only realizes complex roots of its denominator commonly called natural frequencies or transfer-function poles, but also complex roots of the numerator, commonly called loss poles or transmission zeros. The numerator zeros of the circuit transfer function are accomplished by a unique feed forward portion of the circuit which supplies the $V_{in}$ analog input signal and the outputs of the first and also the second integrating operational amplifier to the third operational amplifier. This third operational amplifier also has its own feedback loop and thus acts as a summer and an integrator and generates an extra simple pole in the transfer function. With the circuit as described and using capacitor valves determined from computer aided optimization methods, the filter produced will closely approximate the desired frequency response and provide optimum response within the preselected frequency range. The filter also has a programability feature in that a pass band edge can be selected by varying the clocking frequency without changing the shape of the frequency response.

In summary, one object of the present invention is to provide an improved analog sampled data recursive filter for an electronic data system having a low sensitivity to the filter coefficients.

Another object of the invention is to provide a sampled data filter of the type described that has finite transmission zeros in the filter transfer function and produces a sharp transition from pass-band to stop-band with a moderate Q.

Another object of the invention is to provide a sampled data filter that is particularly adaptable for use as a low pass filter in an electronic data system.

Still another object of the invention is to provide a sampled data filter that is particularly adaptable for implementation as part of an MOS-type integrated circuit requiring a minimum amount of chip area.

Another object of the invention is to provide a sampled data filter than is programmable so that the pass-band frequency can be selected by varying the clocking rate.

Other objects, advantages and features of the invention will become apparent from the following detailed description presented in conjunction with the accompanying drawing.

BRIEF DESCRIPTION OF THE DRAWING

FIG. 1 is a circuit diragram of the filter according to the invention;

FIG. 2 is a loss/frequency plot showing the desired limited for a typical low pass filter;

FIG. 3 is an actual plot of loss vs. frequency for a low pass filter having performance characteristics according to the invention.

DETAILED DESCRIPTION OF THE EMBODIMENT

With reference to the drawing, FIG. 1 shows a circuit diagram for a sampled-data filter 10 embodying the principles of the present invention which is adapted to be connected to, and to receive data from, a transmission source of a typical electronic data system. Thus, the input ($V_{in}$) in the input lead 12 is a varying signal voltage representing a range of frequencies, and the function of the filter is to sample the analog input in clocked increments, pass all frequencies in a preselected range to an output lead 14 as an output voltage ($V_o$) and to attenuate or block all other frequencies of the input voltage that are not in the selected pass range.

The analog input voltage $V_{in}$ is supplied through a terminal to a first branching lead 16 connected to a first switch means 18 and through a second branching lead 20 to a second switch means 22.

Throughout the diagram of FIG. 1, the various "switch means," are shown in the form of MOSFET pairs operated by a two-phase non-overlapping clock driver (not shown). For each switch means, one MOS- FET has its gate connected to one clock driver ($\phi$) and the other MOSFET gate is connected to a non-overlapping alternating clock driver ($\bar{\phi}$). An intermediate terminal between each MOSFET pair is connected to a grounded capacitor.

Thus, in switch means 18, its intermediate terminal 24 is connected via a lead 26 to a grounded capacitor 28. The $\phi$ phase MOSFET is connected to the $V_{in}$ supply and the $\bar{\phi}$ phase MOSFET is connected through a feed forward lead 30 to a terminal 32. In the switch means 22, the $\bar{\phi}$ MOSFET is connected to $V_{in}$ and the $\phi$ MOSFET is connected via a lead 34 to the negative input of a first integrating operational amplifier 36 whose positive terminal is connected to ground. An intermediate terminal 38 for the switch means 22 is connected to one side of a capacitor 40 whose other side is connected to an intermediate terminal 42 for another MOSFET switch means 44.

The $\bar{\phi}$ MOSFET for this switch means 42 is connected to ground while its $\phi$ phase MOSFET is connected via a feedback lead 46 to the output lead 48 of a second integrating operational amplifier 50.

In parallel with the first operational amplifier 36 is a lead 54 containing a capacitor 56 and also another lead 58 containing a fourth switch means 60 comprised of a pair of MOSFETs connected to the $\phi$ and $\bar{\phi}$ clock drivers on opposite sides of a terminal 62 connected to one side of another capacitor 64 whose other side is grounded.

The leads 54 and 58 are connected to the input lead 34 and also to an output lead 68 extending from the first operational amplifier 36. This output lead is connected to a $\phi$ phase MOSFET of a fifth switch means 70 whose other $\bar{\phi}$ phase MOSFET is connected via a lead 72 to the negative input of the second operational amplifier 50. An intermediate terminal 24 between the two MOSFETS of the switch means 70 is connected to one side of a grounded capacitor 76.

Extending from the output led 68 of the first operating amplifier 36 is a branching lead 80 which is connected to a $\phi$ phase MOSFET of a sixth switch means 82. The other $\bar{\phi}$ MOSFET of this latter switch means is connected by a lead 84 to ground. An intermediate terminal 86 of switch means 82 is connected to one side of a capacitor 88 whose other side is connected to the intermediate terminal 90 of a seventh switch means 92. The $\phi$ MOSFET of this latter switch means is connected to ground while the $\bar{\phi}$ MOSFET is connected via a lead 94 to the feed forward lead 30.

Extending between input lead 72 and output led 48 and thus in parallel with the second operational amplifier 60 is a lead 96 containing a capacitor 98 thereby making it an integrating type operational amplifier. The output lead 48 is connected to a $\phi$ phase MOSFET of an eighth switch means 100 whose $\bar{\phi}$ phase MOSFET is connected via a lead 102 to the terminal 32 on the feed forward lead 30. An intermediate terminal for the switch means 100 is connected via a lead 104 to one side of a capacitor 106 whose other side is grounded.

A lead 108 extends from the terminal 32 forming the function of the feed forward lead 30 and the output lead 102 of the second operational amplifier 50, to the negative input terminal for a third operational amplifier 110, whose positive terminal is connected to ground and whose output is provided in lead 14. In parallel with the operational amplifier 110 and connected between its input lead 108 and its output lead 14 is a lead 112 containing a capacitor 114 and also a lead 116 containing a ninth switch means 118. The latter has an intermediate terminal 120 connected between a pair of $\phi$ and $\bar{\phi}$ phase connected MOSFETS and also to one side of a capacitor 122 whose other side is connected to ground.

The three operational amplifiers 36, 50 and 110 are also implemented with MOS elements in a suitable circuit configuration connected to $V_{SS}$ and $V_{DD}$ voltage sources. A detailed circuit for the operational amplifiers is not shown since such components are well known and can be selected with suitable characteristics by one skilled in the art.

In the operation of the filter circuit 10, the two-phase non-overlapping clock is constantly supplying $\phi$ and $\bar{\phi}$ pulses to the switching MOSFETS at the sampling frequency $f_c = 1/T$. At a time $(n-1)$ T when clock phase $\phi$ is "on" the capacitor 26 is being charged by $V_{in}(n-1)$. The capacitor 40 is also being charged by $V_{in}$ but less the amount of charge from the second operational amplifier 50 through the feedback lead 48. The capacitors 64, 76 and 88 are being charged by the output from the first operational amplifier 36 and the capacitor 106 is being charged by the output of the second operational amplifier. The capacitor 122 of the third operational amplifier is also being charged during phase $\phi$. Now, at the end of the $\phi$ phase period when all switch means effectively move to phase $\bar{\phi}$, the charge from capacitor 28 is fed forward through lead 30 to terminal 32 and from there through lead 108 to the negative input of the third operational amplifier 110. Since the switch means 82 and 92 are now also in their $\bar{\phi}$ phase, the lead 30 is also supplied with charge through lead 94 from capacitor 88. The operational amplifier 110 also is supplied with the discharge from capacitor 106 through terminal 32 and lead 102, and thus it functions as a summer to all of the aforementioned voltages fed to its negative input. The capacitor 40 discharges through lead 34 to the negative input of the first operational amplifier 36 and similarly capacitor 76 discharges through lead 72 to the negative input of the second operational amplifier 50. During the $\bar{\phi}$ clock phase, the input voltage applied to the first operational amplifier 36 from the capacitor 40 via lead 34 is integrated by its parallel connected capacitor 56. Similarly, the charge from capacitor 106 is also supplied to the capacitor 114 in parallel with the third operational amplifier 110.

The first operational amplifier integrator circuit has a feedback capacitor 64 connected to ground and also to the switch 60 in a parallel lead 58. Similarly, the third operational amplifier integrator circuit has the capacitor 122 connected to ground and to a parallel lead 118. Also, during the $\bar{\phi}$ clock phase the capacitor 64 provides a feedback to the input of operational amplifier 36 and the capacitor 122 provides a feedback to the input of 110.

Thus, from the foregoing, it is seen that during the $\bar{\phi}$ time phase the input voltage $V_{in}$ stored in capacitor 28 during the prior time phase $\phi$, the output voltage $V_{01}$ from the first operational amplifier 36 stored in capacitor 88 and the output voltage $V_{02}$ from the second operational amplifier 50 stored in capacitor 106 are all fed forward to the negative input of the third operational amplifier 110 and are effectively summed by it in producing its output voltage $V_0$. Simultaneously, during the same $\bar{\phi}$ time phase, the third operational amplifier provides a feedback from its previously charged capacitor 122 in the same manner that the first operational amplifier 36 is provided a feedback from its capacitor 64.

By virtue of the third operational amplifier and its summing of the samples from the input $V_{in}$ and the outputs of the first and second integrating operational amplifier the transfer function of the circuit $H_0(Z)$ is provided with zeros in its numerator. The feedback portion of the third operational amplifier provides a simple pole (a third pole) in the denominator of the transfer function. The presence of these zeros and poles in the transfer function provides a circuit with characteristics approximating an elliptic filter, a highly efficient and near optimum form of filter providing a fast transition between passband and stopband.

The mathematics of filter characteristics is generally well known to those skilled in the art. In the present invention the aforesaid important features of the filter circuit 10 can be described mathematically by reference to its transfer function.

Using the z-transform technique, the general form of the transfer function for the circuit 10 having two complex conjugate poles, one simple pole and two complex conjugate zeros is:

$$H(z) = A \frac{z^2 - 2 r_o \cos \theta_o z + r_o^2}{(z^2 - 2 r_p \cos \theta_p Z + r_p^2)(z - \beta)} \quad \text{Equation (1)}$$

where:

$z_{p1} = r_p e^{j\theta_p}$
$z_{p1} = r_p e^{-j\theta_p}$  are the complex conjugate poles;

$\beta$ is a real axis pole;

$z_{01} = r_o e^{j\theta_o}$
$z_{02} = r_o e^{-j\theta_o}$  are the complex conjugate transmission zeros.

The specific transfer function for the circuit 10 in terms of the capacitor ratios as derived from the charge conservation equation is given by:

$$H_o(z) = \frac{V_o(z)}{V_{in}(z)} = -\alpha_3 K \frac{z^2 - (2 + \alpha_1 - \alpha_1\alpha_4/\alpha_3)z + 1 - \alpha_1\alpha_2 - \alpha_1 + \frac{\alpha_1\alpha_2 - \alpha_4\alpha_1}{\alpha_3}}{[z^2 - (2 - \alpha_1)z + 1 - \alpha_1 + \alpha_1\alpha_2](z - 1 + \alpha_5)}$$

where:
$z = e^{j\Omega T}$ is the z variable
$\Omega = 2\pi f$ is the analog radian frequency;
$T =$ sampling period;
$w = \Omega T$ is the discrete time frequency;
$\alpha_1, \alpha_2, \alpha_3, \alpha_4$ and $\alpha_5$ represent the ratio of values of the designated capacitors of the circuit as indicated on FIG. 1.

To design a particular filter within predetermined band limits using the circuit 10 of the present invention, it is necessary to determine the values of the various capacitors of the circuit.

Using the general transfer function, this is accomplished by first selecting values for the elements $r_o$, $\theta_o$, $r_p$, $\theta_p \beta$ and A such that the magnitude of H(z) for $z = e^{jw}$ approximates a prespecified loss characteristic for the desired filter, as shown in FIG. 2. On this loss plot for a low pass filter, the pass band frequency ($f_p$) is represented by vertical line connected to a horizontal minimum loss value line which is the "$\alpha_{max}$." level. The desired stop band frequency ($f_s$) is represented by another vertical line connected to a maximum loss or $\alpha_{min}$ line that is horizontal in the plot. Since equation No. 2 has a rather special form, the actual filter design can be carried out by computer aided optimization methods. After finding the values for the parameters $r_o$, $\theta_o$, $r_p$, $\theta_p$ and $\beta$, the capacitor ratios for the specified filter parameters can be obtained by equating the corresponding coefficients of the "z" power in equations 1 and 2. Those ratios which are designated in the drawing in FIG. 1 are as follows:

$$\alpha_1 = 2(1 - r_p \cos \theta_p) \quad (1)$$

$$\alpha_2 = 1 + (r_p^2 - 1)/\alpha_1 \quad (2)$$

$$\alpha_4/\alpha_3 = [2(1 - r_o \cos \theta_o) - \alpha_1]/\alpha_1 \quad (3)$$

$$\alpha_3 = \alpha_1\alpha_2/(r_o^2 - r_p^2 + \alpha_4/\alpha_3) \quad (4)$$

$$\alpha_5 = 1 - \beta \quad (5)$$

$$k = A/\alpha_3 \quad (6)$$

With the proper values ascertained for the capacitor elements, the circuit 10, as described will provide a filter section that realizes finite transmission zeros and produces a sharp transition from pass-band to stopband. The actual loss curve for a typical loss pass filter in accordance with the invention is shown in FIG. 3. In designing a particular filter, if the loss characteristic is specified, then the order of the filter is determined such that the loss response of the filter will remain within the specified limits. For a higher order filter or more complex loss characteristics, the tandem connection of more than one section 10 will be necessary. In such a case, the values of the capacitors must be recalculated in accordance with the above procedure.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:
1. An electronic filter comprising:
    an input terminal means adapted for connection with an input voltage source to be filtered;
    a first integrating operational amplifier having a capacitor feedback means and an input connected to said input terminal means;
    a second integrating operational amplifier connected to the output of said first operational amplifier;
    a third integrating operational amplifier having a capacitor feedback means and connected to the output of said second operational amplifier;
    a negative feedback connection between the output of said second operational amplifier and the input to said first operational amplifier;
    a feed forward connection between said input terminal means, the output of said first operational amplifier and the output of said second operational amplifier and the input of said third operational amplifier;
    switch means in said feed forward conduit, said feedback conduit, said capacitor feedback means for said first and third operational amplifiers and between said first and second operational amplifiers and between said first operational amplifier and said feed forward conduit, each said switch means connected to a capacitor which is continuously charged and discharged on alternative, successive clock cycles;

whereby an analog voltage from said input source is converted into a sampled data signal and an output is produced from said third operational amplifier having only those frequencies in a preselected pass band.

2. The electronic filter as described in claim 1, wherein each said switch means comprises a pair of MOSFET devices connected to an alternating clock driver which provides continuous non-overlapping $\phi$ and $\bar{\phi}$ phase clock signals, said capacitor for each said switch means being connected between ground and a terminal between said pair of MOSFET devices.

3. The electronic filter as described in claim 1, wherein the general transfer function for its circuit has two complex conjugate poles, one simple pole and two complex conjugate zeros.

4. The electronic filter as described in claim 3, wherein said transfer function for its circuit in the z-domain is defined as:

$$H(z) = A \frac{z^2 - 2 r_o \cos \theta_o z + r_o^2}{(z^2 - 2 r_p \cos \theta_p z + r_p^2)(z - \beta)}$$

where:

$$z_{p1} = r_p e^{j\theta_p}$$
$$z_{p2} = r_p e^{-j\theta_p}$$

are the complex conjugate poles;

$\beta$ is a real axis pole;

$$z_{01} = r_o e^{j\theta_o}$$
$$z_{02} = r_o e^{-j\theta_o}$$

are the complex conjugate transmission zeros.

5. The electronic filter as described in claim 1, wherein the switched capacitor in said feed forward connection between said first and third operational amplifiers has a value of $K\alpha_3 C_3$, the switched capacitor in said feed forward connection between said second and third operational amplifiers has a value of $\alpha_4 C_4$, the switched capacitor in said negative feedback connection has a value of $\alpha_1 C_1$, the switched capacitor in a connection between said first and second operational amplifiers has a value of $\alpha_2 C_2$, the switched capacitor in a connection between said second and third operational amplifiers has a value of $KC_3$, the switched capacitor in the feedback loop of said first operational amplifier having a value of $\alpha_1 C_1$, the switched capacitor in the feedback loop of said third operational amplifier having a value of $\alpha_5 C_3$, wherein:

$$\alpha_1 = 2(1 - r_p \cos \theta_p) \quad (1);$$

$$\alpha_2 = 1 + (r_p^2 - 1)/\alpha_1 \quad (2);$$

$$\alpha_4/\alpha_3 = ]2(1 - r_o \cos \theta_o) - \alpha_1]/\alpha_1 \quad (3);$$

$$\alpha_3 = \alpha_1 \alpha_2/(r_o^2 - r_p^2 + \alpha_4/\alpha_3) \quad (4);$$

$$\alpha_5 = 1 - \beta \quad (5);$$

$$K = A/\alpha_3 \quad (6);$$

(7) $C_1$ = is the integrating capacitor for the first operational amplifier;

(8) $C_2$ = is the integrating capacitor for the second operational amplifier; and (9) $C_3$ = is the integrating capacitor for the third operational amplifier.

* * * * *

UNITED STATES PATENT AND TRADEMARK OFFICE
CERTIFICATE OF CORRECTION

PATENT NO. : 4,179,665          Page 1 of 2
DATED : December 18, 1979
INVENTOR(S) : Roubik Gregorian It is certified that error appears in the above—identified patent and that said Letters Patent is hereby corrected as shown below:

In Column 1, line 24, delete "has" and insert --had--;

In Column 1, line 35, delete "pules" and insert --pulses--;

In Column 2, line 5, delete "valves" and insert --values--;

In Column 2, line 39, delete "diragram" and insert --diagram--;

In Column 3, line 11, interchange "$\phi$" and "$\bar{\phi}$";

In Column 3, line 26, delete "MOSFETs" and insert --MOSFETS--;

In Column 3, line 39, delete "led" and insert --lead--;

In Column 5, line 40, delete the entire equation and replace with the following equation:

UNITED STATES PATENT AND TRADEMARK OFFICE
CERTIFICATE OF CORRECTION

PATENT NO. : 4,179,665            Page 2 of 2
DATED : December 18, 1979
INVENTOR(S) : Roubik Gregorian It is certified that error appears in the above—identified patent and that said Letters Patent is hereby corrected as shown below:

$$H_o(z) = \frac{V_o(z)}{V_{in}(z)} = -\alpha_3 K \frac{z^2 - (2 - \alpha_1 - \alpha_1\alpha_4/\alpha_3)z + 1 - \alpha_1\alpha_2 - \alpha_1 + \frac{\alpha_1\alpha_2 - \alpha_4\alpha_1}{\alpha_3}}{[z^2 - (2 - \alpha_1)z + 1 - \alpha_1 + \alpha_1\alpha_2](z - 1 + \alpha_5)}$$

Signed and Sealed this

Twenty-third Day of August 1983

[SEAL]

Attest:

GERALD J. MOSSINGHOFF

Attesting Officer      Commissioner of Patents and Trademarks